(12) United States Patent
Kishida et al.

(10) Patent No.: US 6,376,055 B1
(45) Date of Patent: Apr. 23, 2002

(54) COMPOSITION FOR CERAMIC SUBSTRATE AND CERAMIC CIRCUIT COMPONENT

(75) Inventors: Kazuo Kishida; Akira Shiratori, both of Shiga-ken; Osamu Yokokura, Omihachiman; Hiroshi Takagi, Otsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/550,826

(22) Filed: Apr. 18, 2000

(30) Foreign Application Priority Data

Jun. 8, 1999 (JP) .......................... 11-160642

(51) Int. Cl.[7] ................................ B32B 3/00
(52) U.S. Cl. .................... 428/210; 501/32; 501/66; 501/77; 428/901
(58) Field of Search .............. 501/32, 66, 77; 428/210, 901

(56) References Cited

U.S. PATENT DOCUMENTS

| | | | |
|---|---|---|---|
| 4,298,389 A | * 11/1981 | Johnson et al. | 501/77 |
| 4,342,553 A | * 8/1982 | Graff et al. | 431/358 |
| 4,777,092 A | 10/1988 | Kawakami et al. | 428/428 |
| 5,212,121 A | * 5/1993 | Omata et al. | 501/32 |
| 5,468,694 A | * 11/1995 | Taguchi et al. | 501/17 |
| 5,534,470 A | * 7/1996 | Andrus et al. | 501/32 |
| 5,811,361 A | * 9/1998 | Miwa | 501/66 |
| 5,864,459 A | * 1/1999 | Lu et al. | 361/234 |
| 5,895,719 A | * 4/1999 | Fyles et al. | 428/220 |
| 6,121,173 A | * 9/2000 | Terashi | 501/4 |

FOREIGN PATENT DOCUMENTS

JP   2-212336   8/1990

* cited by examiner

*Primary Examiner*—Cathy Lam
(74) *Attorney, Agent, or Firm*—Ostrolenk, Faber, Gerb & Soffen, LLP

(57) ABSTRACT

There is disclosed a composition for a ceramic substrate comprising a mixture of: powdered borosilicate-based glass comprising about 5% to 17.5% by weight of $B_2O_3$, about 28% to 44% by weight of $SiO_2$, 0% to about 20% by weight of $Al_2O_3$, and about 36% to 50% by weight of MO (where MO is at least one selected from the group consisting of CaO, MgO, and BaO), and a powdered ceramic; in which the amount of the powdered borosilicate-based glass is about 40% to 49% by weight based on the total amount of the composition for a ceramic substrate, and the amount of the powdered ceramic is about 60% to 51% by weight based on the total amount of the composition for a ceramic substrate.

17 Claims, 1 Drawing Sheet

COMPOSITION FOR CERAMIC SUBSTRATE AND CERAMIC CIRCUIT COMPONENT

BACKGROUND OF THE INVENTION

1. Field of the Invention

The present invention relates to a composition for a ceramic substrate and a ceramic circuit component, and more particularly to a composition for a ceramic substrate which can be sintered at a temperature as low as 1,000° C. or less, and a ceramic circuit component, such as a multilayered integrated circuit component and a thick-film hybrid circuit component, which is fabricated using the composition for the ceramic substrate.

2. Description of the Related Art

Currently, alumina substrates are predominantly used as ceramic substrates. In order to obtain an alumina substrate, firing must be performed at a temperature as high as approximately 1,600° C., and thereby, for example, when a multilayered circuit component is fabricated using the alumina substrate, a metal having a high melting point must be used for internal conductors. However, the metal having a high melting point generally has a high resistance and is thus unsuitable for conductors used for multilayered circuit components in which higher frequencies and higher speeds are increasingly in demand.

Accordingly, glass-ceramic substrates having a firing temperature of 1,000° C. or less, which enable use of metals having a low resistance as internal conductors, such as Au, Ag, Ag—Pd, Ag—Pt and Cu, have been receiving attention and various types of glass-ceramic substrates have been developed.

For example, Japanese Examined Patent Publication No. 3-53269 discloses a low-temperature sinterable ceramic substrate which is obtained by mixing 50% to 64% by weight of powdered glass and 50% to 35% by weight of powdered $Al_2O_3$, followed by sintering at 800 to 1,000° C.

However, with respect to such a substrate in which glass is loaded at the rate of 50% or more, the proportion of crystalline substances in the sintered substrate is decreased, and thus the dielectric loss of the substrate may be increased or it may be difficult to obtain high mechanical strength, which is disadvantageous. Additionally, when a thick-film electrode and a thick-film resistor are baked on the surface of the sintered substrate, the substrate easily deforms under the influence of the remaining glass, which is also disadvantageous.

As a solution to the problems described above, the composition of the powdered glass as a starting material may be arranged so as to be easily crystallized after sintering, thus increasing the proportion of crystalline substances in the sintered substrate. However, with a substrate having a large proportion of glass in the starting material, such as with a glass load of 50% or more, strain in the substrate caused by the crystallization of glass during firing is influential, and deformation, such as warpage and cracking, easily occurs in the sintered substrate, which is disadvantageous.

Japanese Examined Patent Publication No. 4-42349 discloses a low-temperature sinterable ceramic composition in which 40% to 50% by weight of powdered glass, composed of 10% to 55% by weight of MO (where M is at least one of Ca and Mg), 0% to 30% by weight of $Al_2O_3$, 45% to 70% by weight of $SiO_2$, and 0% to 30% by weight of $B_2O_3$, and 60% to 50% by weight of powdered $Al_2O_3$ are mixed and fired at 1,100° C. or less. The above patent publication also discloses that by increasing the proportion of the powdered $Al_2O_3$ in the starting material, a transverse strength of 2,600 to 3,200 $kgf/cm^2$ (255 to 314 MPa) can be obtained. However, such transverse strength is lower than the transverse strength (approximately 350 MPa) of the alumina substrate which is used as a circuit substrate, and higher strength is desired.

The substrate disclosed in the same patent publication has a coefficient of thermal expansion in the range from 4.0 to 5.7 ppm/° C. It has been believed that a substrate having a low coefficient of thermal expansion is preferable on the assumption that a silicon chip (IC) having a coefficient of thermal expansion of 3.5 ppm/° C. is directly mounted on the substrate. However, due to the development of a mounting method in which stress is relieved using a cushioning material such as an underfilling, a mismatch in the coefficient of thermal expansion between the ceramic substrate and the silicon chip does not greatly cause a problem. In addition, the size of the silicon chip has not increased as has been expected.

Under the circumstances where the ceramic substrate is joined to a larger resin substrate as a motherboard, a mismatch in the coefficient of thermal expansion between the ceramic substrate and the resin substrate is rather influential. For example, a typical glass epoxy (FR-4) has a coefficient of thermal expansion of 14 to 16 ppm/° C., and an epoxy reinforced with Aramid fibers has a coefficient of thermal expansion of approximately 8 ppm/° C. If a degree of mismatch in the coefficient of thermal expansion between the ceramic substrate and the resin substrate is increased, the reliability of the connection between the two substrates is lost, which is disadvantageous.

SUMMARY OF THE PRESENT INVENTION

To overcome the above described problems, preferred embodiments of the present invention provide a composition for a ceramic substrate and a ceramic circuit component fabricated using the same, in which the problems described above can be solved.

More specifically, in accordance with the preferred embodiments of the present invention, a composition for a ceramic substrate used for electronic circuits with a firing temperature of 1,000° C. or less is provided, thus enabling metals having a low resistance, such as Au, Ag, Ag—Pd, Ag—Pt and Cu, to be used as internal conductors. In a ceramic substrate obtained by firing the composition, it is possible to achieve a transverse strength of 300 MPa or more, a Q factor (1 MHZ) of 1,400 or more, and a coefficient of thermal expansion of 6.0 ppm/° C. or more.

One preferred embodiment of the present invention provides a composition for a ceramic substrate, comprising a mixture of: powdered borosilicate-based glass comprising about 5% to 17.5% by weight of $B_2O_3$, about 28% to 44% by weight of $SiO_2$, 0% to about 20% by weight of $Al_2O_3$, and about 36% to 50% by weight of MO (where MO is at least one selected from the group consisting of CaO, MgO and BaO); and a powdered ceramic; in which the amount of the powdered borosilicate-based glass is about 40% to 49% by weight based on the total amount of the composition for a ceramic substrate, and the amount of the powdered ceramic is about 60% to 51% by weight based on the total amount of the composition for a ceramic substrate.

Preferably, the composition for the ceramic substrate has a coefficient of thermal expansion of about 6.0 ppm/° C. or more after sintering.

Preferably, the powdered ceramic contains powdered alumina.

The borosilicate-based glass may contain at least one alkali metal oxide selected from the group consisting of $Li_2O$, $K_2O$ and $Na_2O$, the amount of the alkali metal oxide being about 5 parts by weight or less relative to 100 parts by weight of the total amount of the $B_2O_3$, $SiO_2$, $Al_2O_3$, and MO.

The borosilicate-based glass may contain at least one compound selected from the group consisting of $TiO_2$, $ZrO_2$, $Cr_2O_3$, $CaF_2$ and CuO, the amount of the compound being about 5 parts by weight or less relative to 100 parts by weight of the total amount of the $B_2O_3$, $SiO_2$, $Al_2O_3$ and MO.

Another preferred embodiment of the present invention provides a ceramic circuit component comprising a substrate obtained by molding and sintering the composition for the ceramic substrate described above and a conductive circuit provided in association with the substrate.

In the ceramic circuit component, the conductive circuit preferably contains at least one metal selected from the group consisting of Ag, Au and Cu as a principal ingredient.

According to the composition for the ceramic substrate of the present invention as described above, since low-temperature sintering at 1,000° C. or less is enabled, when a ceramic circuit component provided with a conductive circuit containing a metal having a low resistance, such as an Ag-based metal or a Cu-based metal is fabricated, firing can be performed simultaneously with the metal for the conductive circuit. In the ceramic substrate fabricated using the composition, it is possible to achieve a high mechanical strength, a low dielectric constant, a low loss and a high coefficient of thermal expansion required for the substrate. Accordingly, a ceramic circuit component, such as a multi-layered ceramic circuit component, having satisfactory characteristics and high reliability can be obtained.

In particular, since it is possible to achieve in accordance with the composition for the ceramic substrate of the present invention, a coefficient of thermal expansion of about 6.0 ppm/° C. or more, satisfactory matching in the coefficient of thermal expansion with a motherboard composed of, for example, an epoxy resin, is obtained, resulting in high connection reliability.

In accordance with the composition for the ceramic substrate of the present invention, when the borosilicate-based glass contains at least one alkali metal oxide selected from the group consisting of $Li_2O$, $K_2O$ and $Na_2O$ with an amount of about 5 parts by weight or less relative to 100 parts by weight of the total of $B_2O_3$, $SiO_2$, $Al_2O_3$ and MO, the softening and flow properties of the glass are accelerated, and even if the glass amount is reduced in the composition for the ceramic substrate, a relatively low sintering temperature can be maintained.

In accordance with the composition for the ceramic substrate of the present invention, when the borosilicate-based glass contains at least one compound selected from the group consisting of $TiO_2$, $ZrO_2$, $Cr_2O_3$, $CaF_2$ and CuO with an amount of about 5 parts by weight or less relative to 100 parts by weight of the total of $B_2O_3$, $SiO_2$, $Al_2O_3$ and MO, the crystallization of the glass is accelerated, and it is possible to further improve the high mechanical strength and the low loss of the resultant ceramic substrate.

Other features and advantages of the present invention will become apparent from the following description of the invention which refers to the accompanying drawing.

DESCRIPTION OF THE PREFERRED EMBODIMENTS

Figure 1:
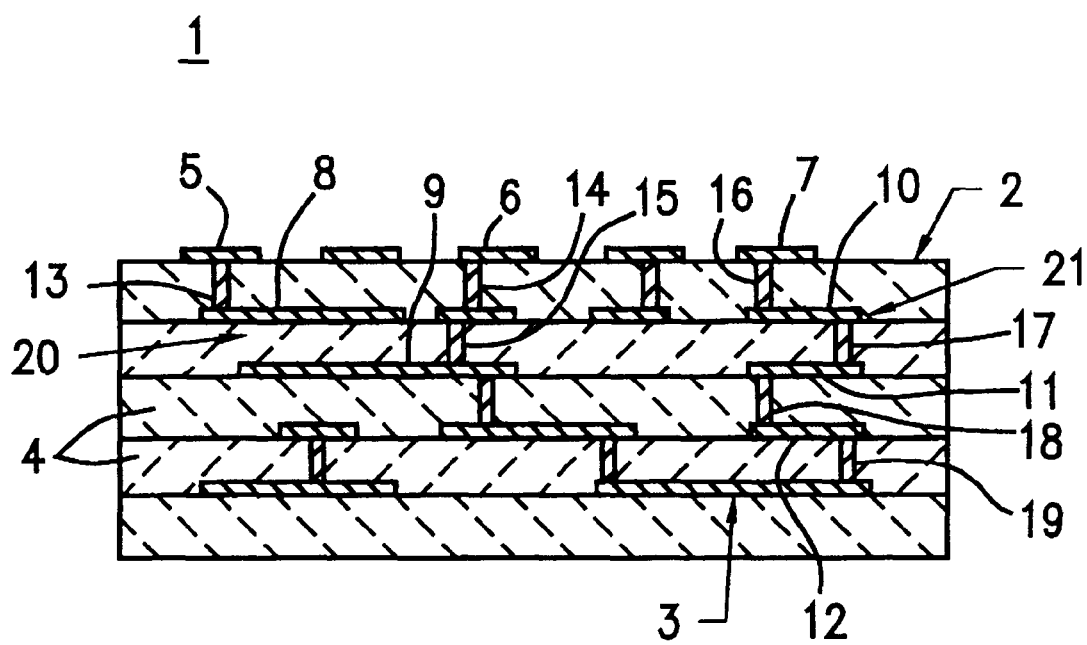
FIG. 1 is a sectional view of a multilayered ceramic circuit component 1 in accordance with an embodiment of the present invention.

The present invention is characterized in that, with respect to a composition for a ceramic substrate composed of a mixture of powdered borosilicate-based glass and a powdered ceramic, such as powdered alumina, which can be fired at low temperatures, by using a powdered borosilicate-based glass having a composition which is easily crystallized after sintering as a sintering additive, and by setting the glass amount lower than the ceramic amount, the proportion of crystalline substances in the sintered ceramic substrate is increased, and a low-temperature sinterable ceramic substrate having a high mechanical strength, a coefficient of thermal expansion as high as about 6.0 ppm/° C. or more, and a low loss can be obtained.

As described above, the crystallization of glass during firing causes strain in the ceramic substrate and deformation may occur in the sintered ceramic substrate. However, since the amount of glass used in the present invention is about 49% by weight or less, which is smaller than the amount of the ceramic, the deformation of the ceramic substrate resulting from the crystallization of the glass during firing can be advantageously suppressed.

The glass functions as a sintering additive for sintering the ceramic substrate at 1,000° C. or less due to softening and viscous flow in the firing process. In order to secure the function as the sintering additive, the amount of glass added must be about 40% by weight or more.

As described above, a crystal phase of wollastonite, anorthite, and the like is easily precipitated from the glass component which is in the softened and viscous flow state, thus enabling the sintered ceramic substrate to have a high mechanical strength and a low loss.

The glass is composed of $B_2O_3$ and $SiO_2$ as glass network-forming oxides, MO as a glass network-modifying oxide (where MO is at least one oxide selected from the group consisting of CaO, MgO and BaO), and $Al_2O_3$ as a glass network intermediate oxide which exhibits the network-forming capacity in collaboration with the network-modifying oxide. The proportion of the oxides is adjusted so that the glass functions as the sintering additive for sintering the ceramic substrate at 1,000° C. or less and the crystal phase is easily precipitated in the sintering process.

Of the $B_2O_3$ and $SiO_2$ glass network-forming oxides, $B_2O_3$ is an oxide for reducing the softening temperature and accelerating viscous flow, and the amount thereof is selected at about 5% to 17.5% by weight. If the amount is less than about 5% by weight, the softening and flow properties of the glass are degraded. If the amount is more than about 17.5% by weight, the water resistance of the glass becomes insufficient, and the properties of the ceramic substrate may be changed when used in a high temperature and high humidity environment, and also the Q factor of the glass itself is decreased, thus decreasing the Q factor of the resultant ceramic substrate.

In the glass network-forming oxides, the $SiO_2$ amount is selected at about 28% to 44% by weight. If the $SiO_2$ amount is less than about 28% by weight, the dielectric constant of the remaining glass itself is increased and a ceramic substrate having a low dielectric constant cannot be obtained. On the other hand, if the amount is more than about 44% by weight, the softening and flow properties of the glass are degraded and thus the ceramic substrate cannot be sintered at 1,000° C. or less. The crystallization of the glass is also inhibited, and thus characteristics such as a high mechanical strength and a low loss cannot be achieved, and the coefficient of thermal expansion of the ceramic substrate is decreased.

The amount of $Al_2O_3$ as the glass network intermediate oxide is 0% to about 20% by weight. The $Al_2O_3$ acts as a glass intermediate oxide and stabilizes the glass structure. If the $Al_2O_3$ amount exceeds about 20% by weight, the softening and flow properties of the glass are degraded and the ceramic substrate cannot be sintered at 1,000° C. or less. The crystallization of the glass is also inhibited, and thus characteristics such as a high mechanical strength and a low loss cannot be achieved.

MO as the glass network-modifying oxide is a component for accelerating the softening and flow properties of the glass and the amount thereof is selected at about 36% to 50% by weight. If the MO amount is less than about 36% by weight, the softening and flow properties of the glass are degraded and the coefficient of thermal expansion of the resultant ceramic substrate is decreased. On the other hand, if the MO amount exceeds about 50% by weight, the glass structure becomes unstable, and a glass of stable quality cannot be obtained.

In the production of the glass having the composition described above, in order to further accelerate the softening and flow properties, at least one alkali metal oxide selected from the group consisting of $Li_2O$, $K_2O$ and $Na_2O$ may be incorporated with an amount of about 5 parts by weight or less relative to 100 parts by weight of the total of $B_2O_3$, $SiO_2$, $Al_2O_3$ and MO. If the amount of the alkali metal oxide exceeds about 5 parts by weight, the electrical insulating properties of the glass are degraded, the electrical insulating properties of the sintered ceramic substrate are degraded, and the coefficient of thermal expansion of the ceramic substrate is also decreased.

In order to further increase the high mechanical strength and the low loss of the resultant ceramic substrate by accelerating the crystallization of the glass in the firing process, at least one compound selected from the group consisting of $TiO_2$, $ZrO_2$, $Cr_2O_3$, $CaF_2$ and CuO may be incorporated with an amount of about 5 parts by weight or less relative to 100 parts by weight of the total of $B_2O_3$, $SiO_2$, $Al_2O_3$ and MO. If the amount of the compound exceeds 5 parts by weight, the sintered ceramic substrate has an excessively high dielectric constant since the dielectric constant of the glass is increased.

The composition for the ceramic substrate described above is advantageously used for producing a ceramic circuit component provided with a substrate obtained by forming and firing the composition and a conductive circuit formed in relation to the substrate.

FIG. 1 is a sectional view which schematically shows a multilayered ceramic circuit component 1, which is an example of the ceramic circuit component described above, in accordance with an embodiment of the present invention. In brief, the multilayered ceramic circuit component 1 includes a ceramic substrate 2 and a conductive circuit 3 which is formed in and/or on the surface of the ceramic substrate 2.

The ceramic substrate 2 is fabricated by firing a ceramic green compact obtained by laminating a plurality of green sheets containing the composition for the ceramic substrate described above, and includes a plurality of ceramic layers 4 obtained by firing the plurality of green sheets, respectively.

The conductive circuit 3 is formed, for example, by firing a conductive paste containing a conductive component comprising at least one metal selected from the group consisting of Ag, Au and Cu as a principal ingredient simultaneously with the ceramic green compact. The conductive circuit 3 is provided with, for example, external conductors 5, 6 and 7 which are formed on the surface of the ceramic substrate 2, and is provided with, for example, internal conductors 8, 9, 10, 11 and 12 which are formed in the ceramic substrate 2, and is also provided with via-hole joints 13, 14, 15, 16, 17, 18 and 19.

The internal conductors 8 and 9 are opposed to each other with a specific ceramic layer 4 therebetween to constitute a capacitor section 20. The via-hole joints 16 to 19 and the internal conductors 10 to 12 are alternately connected to each other to constitute an inductor section 21.

EXAMPLES

Compositions for ceramic substrates in the present invention will now be described in detail based on examples.

Table 1 shows ingredients of the compositions for ceramic substrates produced in the examples.

TABLE 1

| Sample No. | Glass Composition | | | | | | | Glass | Ceramic | |
|---|---|---|---|---|---|---|---|---|---|---|
| | MO (% by weight) | | | $Al_2O_3$ (% by weight) | $B_2O_3$ (% by weight) | $SiO_2$ (% by weight) | Others (parts by weight) | Amount (% by weight) | Type | Amount (% by weight) |
| | CaO | MgO | BaO | | | | | | | |
| 1 | 36 | 0 | 0 | 16 | 6 | 42 | — | 49 | Alumina | 51 |
| 2 | 45 | 0 | 0 | 13 | 14 | 28 | — | 46 | Alumina | 54 |
| 3 | 50 | 0 | 0 | 7 | 9.5 | 33.5 | — | 45 | Alumina | 55 |
| 4 | 37 | 0 | 0 | 20 | 8 | 35 | — | 45 | Alumina | 55 |
| 5 | 46 | 0 | 0 | 5 | 7 | 42 | — | 47 | Alumina | 53 |
| 6 | 46 | 0 | 0 | 5 | 7 | 42 | — | 44 | Alumina | 56 |
| 7 | 35 | 0 | 5 | 12 | 8 | 40 | — | 44 | Alumina | 56 |
| 8 | 38 | 0 | 0 | 17 | 5 | 40 | — | 48 | Alumina | 52 |
| 9 | 40 | 0 | 0 | 8 | 12 | 40 | — | 42 | Alumina | 58 |
| 10 | 42 | 0 | 0 | 5.5 | 10 | 42.5 | — | 48 | Alumina | 52 |
| 11 | 42 | 0 | 0 | 5 | 9 | 44 | — | 49 | Alumina | 51 |
| 12 | 42 | 0 | 0 | 9.5 | 6 | 42.5 | — | 48 | Alumina | 52 |
| 13 | 42 | 0 | 0 | 5.5 | 10 | 42.5 | — | 48 | Alumina Forsterite | 42 10 |
| 14 | 45 | 0 | 0 | 5 | 7 | 43 | $TiO_2$: 1.0 | 48 | Alumina | 52 |
| 15 | 30 | 10 | 0 | 12 | 8 | 40 | $ZrO_2$: 1.0 | 44 | Alumina | 56 |

TABLE 1-continued

| Sample No. | Glass Composition | | | | | | | Glass Amount (% by weight) | Ceramic | |
|---|---|---|---|---|---|---|---|---|---|---|
| | MO (% by weight) | | | $Al_2O_3$ (% by weight) | $B_2O_3$ (% by weight) | $SiO_2$ (% by weight) | Others (parts by weight) | | Type | Amount (% by weight) |
| | CaO | MgO | BaO | | | | | | | |
| 16 | 40 | 0 | 0 | 9 | 8 | 43 | $Cr_2O_3$: 1.0 | 46 | Alumina | 54 |
| 17 | 39 | 6 | 0 | 5 | 7 | 43 | $CaF_2$: 1.0 | 46 | Alumina | 54 |
| 18 | 45 | 0 | 0 | 5 | 7 | 43 | CuO: 0.5 | 46 | Alumina | 54 |
| 19 | 45 | 0 | 0 | 0 | 17.5 | 37.5 | CuO: 0.25 | 41 | Alumina | 59 |
| 20 | 40 | 0 | 0 | 0 | 16 | 44 | CuO: 0.25 | 45 | Alumina | 55 |
| 21 | 40 | 0 | 0 | 9 | 8 | 43 | CuO: 0.5 | 48 | Alumina | 52 |
| 22 | 37 | 0 | 0 | 20 | 8 | 35 | $Li_2O$: 1.0 | 40 | Alumina | 60 |
| 23 | 37 | 0 | 0 | 20 | 8 | 35 | $K_2O$: 3.0 | 42 | Alumina | 58 |
| 24 | 37 | 0 | 0 | 20 | 8 | 35 | $Na_2O$: 2.0 | 41 | Alumina | 59 |
| 25 | 34 | 0 | 0 | 10 | 12 | 44 | — | 46 | Alumina | 54 |
| 26 | 52 | 0 | 0 | 8 | 8 | 32 | — | 44 | Alumina | 56 |
| 27 | 37 | 0 | 0 | 22 | 11 | 30 | — | 48 | Alumina | 52 |
| 28 | 47 | 0 | 0 | 10 | 3 | 40 | — | 48 | Alumina | 52 |
| 29 | 38 | 0 | 0 | 11 | 19 | 32 | — | 44 | Alumina | 58 |
| 30 | 49 | 0 | 0 | 18 | 7 | 26 | — | 46 | Alumina | 54 |
| 31 | 39 | 0 | 0 | 7 | 8 | 46 | — | 48 | Alumina | 52 |
| 32 | 35 | 5 | 0 | 5 | 13 | 42 | — | 38 | Alumina | 62 |
| 33 | 40 | 0 | 0 | 7 | 13 | 40 | — | 52 | Alumina | 48 |

First, oxides or carbonates, as starting materials, were prepared so as to satisfy the glass compositions shown in Table 1. A mixture was melted in a Pt crucible for one hour at 1,300 to 1,700° C. according to the glass composition. After the melt was quenched, grinding was performed and powdered glass for each sample was obtained. Additionally, Table 1 shows, with respect to MO (CaO, MgO and BaO), $Al_2O_3$, $B_2O_3$ and $SiO_2$, which were starting materials, the compositional ratios in units of "% by weight", and with respect to other starting materials, such as $TiO_2$, the compositional ratios are shown in units of "parts by weight" relative to 100 parts by weight of the total of MO, $Al_2O_3$, $B_2O_3$ and $SiO_2$.

Next, each powdered glass obtained as described above and a powdered ceramic, such as powdered alumina, were mixed at a ratio between the "glass amount" and the "ceramic amount" shown in Table 1, and a solvent, binder and a plasticizer were added thereto, followed by fully mixing. By employing the doctor blade process, green sheets were obtained.

Based on the green sheets for the individual samples obtained as described above, several forms of specimens were prepared, and evaluations were conducted with respect to "transverse strength", "relative dielectric constant ($\epsilon_r$)", "Q", "coefficient of thermal expansion", and "precipitated crystal phase".

TABLE 2

| Sample No. | Firing Temperature ° C. | Transverse Strength MPa | $\epsilon_r$ | Q | Coefficient of Thermal Expansion (ppm/° C.) | Precipitated Crystal Phase |
|---|---|---|---|---|---|---|
| 1 | 900 | 330 | 8.5 | 1,900 | 7.8 | A |
| 2 | 860 | 340 | 8.8 | 2,500 | 8.8 | A, W |
| 3 | 870 | 330 | 8.7 | 3,200 | 8.3 | A, W |
| 4 | 880 | 325 | 8.6 | 2,800 | 8.3 | A, W |
| 5 | 820 | 350 | 7.2 | 4,000 | 7.9 | A, W |
| 6 | 880 | 335 | 7.6 | 4,300 | 7.6 | A, W |
| 7 | 880 | 335 | 8.7 | 2,000 | 7.5 | A |
| 8 | 890 | 340 | 8.7 | 1,700 | 8.2 | A |
| 9 | 990 | 350 | 8.6 | 1,700 | 7.4 | A |
| 10 | 850 | 310 | 7.9 | 2,900 | 7.4 | A, W |
| 11 | 860 | 310 | 7.8 | 3,200 | 7.2 | A, W |
| 12 | 880 | 320 | 8.2 | 1,900 | 7.9 | A, W |
| 13 | 860 | 300 | 7.7 | 3,200 | 7.7 | A, W, F |
| 14 | 880 | 330 | 7.8 | 5,000 | 7.6 | A, W |
| 15 | 890 | 335 | 8.8 | 2,500 | 6.3 | A, W |
| 16 | 860 | 320 | 8.5 | 2,600 | 7.5 | A, W |
| 17 | 870 | 315 | 8.7 | 2,700 | 6.7 | A, W |
| 18 | 880 | 340 | 7.8 | 3,700 | 7.5 | A, W |
| 19 | 890 | 325 | 8.4 | 2,500 | 6.9 | A, W |
| 20 | 860 | 315 | 8.6 | 2,500 | 6.0 | A, W |
| 21 | 850 | 325 | 8.8 | 2,600 | 7.5 | A, W |
| 22 | 880 | 330 | 8.7 | 2,100 | 8.2 | A |
| 23 | 880 | 330 | 8.7 | 2,100 | 8.2 | A |
| 24 | 880 | 330 | 8.7 | 1,900 | 8.2 | A |
| 25 | 1,000 | dense sintered compact unobtainable | | | | |
| 26 | 880 | 250 | 8.2 | 1,200 | 8.5 | A, W |

TABLE 2-continued

| Sample No. | Firing Temperature ° C. | Transverse Strength MPa | $\epsilon_r$ | Q | Coefficient of Thermal Expansion (ppm/° C.) | Precipitated Crystal Phase |
|---|---|---|---|---|---|---|
| 27 | 1,000 | dense sintered compact unobtainable | | | | |
| 28 | 1,000 | dense sintered compact unobtainable | | | | |
| 29 | 820 | 300 | 8.8 | 1,000 | 7.4 | A |
| 30 | 880 | 280 | 9.1 | 1,500 | 8.9 | A |
| 31 | 900 | 290 | 7.9 | 1,700 | 5.8 | A, W |
| 32 | 1,000 | dense sintered compact unobtainable | | | | |
| 33 | 840 | 280 | 7.9 | 2,500 | 7.1 | A |

First, after a predetermined number of green sheets for each sample were laminated and cut in predetermined sizes, firing was performed at the firing temperature shown in Table 2, and thus a sintered compact was obtained. By an abrasive process, the dimensions thereof were set at 36 mm long, 4 mm wide and 3 mm thick. With respect to the sintered compact thus obtained for each sample, the transverse strength (three-point bending) was measured according to Japanese Industrial Standard (JIS) R 1601. The precipitated crystal phase in the sintered compact was also identified by X-ray diffraction analysis. In the column of the precipitated crystal phase in Table 2, "A" represents alumina, "W" represents wollastonite, and "F" represents forsterite.

After a predetermined number of green sheets for each sample were laminated, firing was performed at the firing temperature shown in Table 2. The resultant sintered compact was cut by a dicing saw and the dimensions were set at 10 mm long, 3 mm wide and 3 mm thick. With respect to the sintered compact of such size, the coefficient of thermal expansion at 25° C. to 500° C. was measured.

Using the green sheets for each sample, a multilayered ceramic circuit component 1 as shown in FIG. 1 was fabricated. That is, holes were made in the green sheets and an Ag-based paste was filled therein to form via-hole joints 13 to 19, and then the Ag-based paste was screen-printed to form the external conductors 5 to 7 and the internal conductors 8 to 12 in predetermined patterns. A predetermined number of the green sheets for forming ceramic layers 4 were laminated, followed by pressing. Firing was performed in air at the firing temperature shown in Table 2, and thus the multilayered ceramic circuit component 1 was obtained.

By applying a voltage with a frequency of 1 MHZ between the external conductors 5 and 6 in the multilayered ceramic circuit component 1, the electrostatic capacity and Q of the capacitor section 20 were measured, and the relative dielectric constant ($\in_r$) was calculated. Table 2 shows the relative dielectric constant ($\in_r$) and Q.

In Tables 1 and 2, Sample Nos. 1 to 24 correspond to examples which are within the scope of the present invention, and Sample Nos. 25 to 33 correspond to comparative examples which are out of the scope of the present invention.

As is clear from Table 2, in Sample Nos. 1 to 24 according to the present invention, the transverse strength was as high as 300 to 350 MPa, $\in_r$ was in the range from 7.0 to 8.8, Q was as large as 1,400 to 5,000, and the coefficient of thermal expansion was as large as 6.0 or more. Thus, satisfactory characteristics for the ceramic substrate in the ceramic circuit component were exhibited.

In Sample Nos. 22 to 24, in which an alkali metal oxide, such as $Li_2O$, $K_2O$ or $Na_2O$, was incorporated in the glass, since the softening temperature of the glass was decreased (in comparison with Sample No. 4 having the same glass composition apart from the fact that an alkali metal was not incorporated), it was confirmed that firing could be performed at the same temperature in spite of the decreased amount of glass.

In Sample Nos. 12 to 21, in which $TiO_2$, $ZrO_2$, $Cr_2O_3$, $CaF_2$ or CuO was incorporated in the glass, although not shown in Table 2, it was confirmed by X-ray diffraction analysis that the crystallization had been accelerated.

In contrast, in comparative example Sample No. 25, since the amount of alkaline earth metal, namely, M, in the glass was low, a dense sintered compact was not obtained when sintered at a temperature of 1,000° C. or less. In Sample No. 26, since the M amount in glass was high, the glass became unstable, and even if the firing temperature was optimized, the density of the sintered compact was not increased sufficiently, and thus the transverse strength was as low as 250 MPa.

In Sample No. 27, a dense sintered compact was not obtained at a firing temperature of 1,000° C. or less because of the excessively large amount of $Al_2O_3$ in the glass.

In Sample No. 28, a dense sintered compact was not obtained at a firing temperature of 1,000° C. or less because of the excessively small amount of $B_2O_3$ in the glass. In Sample No. 29, Q was as low as 1,000 because of the excessively large amount of $B_2O_3$ in the glass.

In Sample No. 30, the relative dielectric constant ($\in_r$) was as large as 9.1 because of the small amount of $SiO_2$ in the glass. In Sample No. 31, having an excessively large amount of $SiO_2$ in the glass, the coefficient of thermal expansion was as low as 5.8.

Because of the small amount of glass added in Sample No. 32, sintering ended in failure at a firing temperature of 1,000° C. or less. In Sample No. 33, the transverse strength was as low as 280 Mpa because of the excessively large amount of glass added.

While the invention has been particularly shown and described with reference to preferred embodiments thereof, it will be understood by those skilled in the art that the forgoing and other changes in form and details may be made therein without departing from the spirit of the invention.

What is claimed is:

1. A composition for a ceramic substrate comprising a mixture of:
   powdered borosilicate glass comprising about 5% to 17.5% by weight of $B_2O_3$, about 28% to 44% by weight of $SiO_2$, 0% to about 20% by weight of $Al_2O_3$ and about 36% to 50% by weight of CaO; and
   a powdered alumina;
   in which
   the amount of the powdered borosilicate glass is about 40% to 49% by weight based on the total amount of the composition for a ceramic substrate, and the amount of the powdered alumina is about 60% to 51% by weight based on the total amount of the composition for a alumina substrate.

2. The composition for a ceramic substrate according to claim 1, wherein the coefficient of thermal expansion after sintering is about 6.0 ppm/° C. or more.

3. The composition for a ceramic substrate according to claim 2, wherein the borosilicate glass contains at least one alkali metal oxide selected from the group consisting of $Li_2O$, $K_2O$ and $Na_2O$ in a positive amount of about 5 parts by weight or less relative to 100 parts by weight of the total of the $B_2O_3$, $SiO_2$, $Al_2O_3$ and MO.

4. The composition for a ceramic substrate according to claim 3, wherein the borosilicate glass contains at least one compound selected from the group consisting of $TiO_2$, $ZrO_2$, $Cr_2O_3$, $CaF_2$ and CuO in a positive amount of about 5 parts by weight or less relative to 100 parts by weight of the total of the $B_2O_3$, $SiO_2$, $Al_2O_3$ and MO.

5. The composition for a ceramic substrate according to claim 4, wherein the borosilicate glass comprises 6% to 16% by weight of $B_2O_3$, 35% to 43% by weight of $SiO_2$, 5% to 17% by weight of $Al_2O_3$ and 37% to 45% by weight of CaO, the amount of the powdered borosilicate glass is 41% to 48% by weight, the amount of alkali metal oxide is 1 to 3 parts by weight and the amount of said at least one compound selected from the group consisting of $TiO_2$, $ZrO_2$, $Cr_2O_3$, $CaF_2$ and CuO is 0.25 to 1 part by weight.

6. The composition for a ceramic substrate according to claim 5, wherein the coefficient of thermal expansion after sintering is at least 6.3 ppm/°C.

7. The composition for a ceramic substrate according to claim 1, wherein the borosilicate glass contains at least one compound selected from the group consisting of $TiO_2$, $ZrO_2$, $Cr_2O_3$, $CaF_2$ and CuO in a positive amount of about 5 parts by weight or less relative to 100 parts by weight of the total of the $B_2O_3$, $SiO_2$, $Al_2O_3$ and MO.

8. The composition for a ceramic substrate according to claim 2, wherein the borosilicate glass contains at least one alkali metal oxide selected from the group consisting of $Li_2O$, $K_2O$ and $Na_2O$ in a positive amount of about 5 parts by weight or less relative to 100 parts by weight of the total of the $B_2O_3$, $SiO_2$, $Al_2O_3$ and MO.

9. The composition for a ceramic substrate according to claim 2, wherein the borosilicate glass contains at least one compound selected from the group consisting of $TiO_2$, $ZrO_2$, $Cr_2O_3$, $CaF_2$ and CuO in a positive amount of about 5 parts by weight or less relative to 100 parts by weight of the total of the $B_2O_3$, $SiO_2$, $Al_2O_3$ and MO.

10. The composition for a ceramic substrate according to claim 1, wherein the borosilicate glass contains at least one alkali metal oxide selected from the group consisting of $Li_2O$, $K_2O$ and $Na_2O$ in a positive amount of about 5 parts by weight or less relative to 100 parts by weight of the total of the $B_2O_3$, $SiO_2$, $Al_2O_3$ and MO.

11. The composition for a ceramic substrate according to claim 1 in the form of a ceramic green sheet.

12. A ceramic circuit component comprising:

a substrate comprising a molded and sintered composition for a ceramic substrate according to claim 1; and a conductive circuit in association with the substrate.

13. The ceramic circuit component according to claim 12, wherein the conductive circuit comprises at least one metal selected from the group consisting of Ag, Au and Cu.

14. A ceramic circuit component comprising:

a substrate comprising a molded and sintered composition for a ceramic substrate according to claim 2; and a conductive circuit in association with the substrate.

15. The ceramic circuit component according to claim 14, wherein the conductive circuit comprises at least one metal selected from the group consisting of Ag, Au and Cu.

16. A ceramic circuit component comprising:

a substrate comprising a molded and sintered composition for a ceramic substrate according to claim 5; and a conductive circuit in association with the substrate.

17. The ceramic circuit component according to claim 16, wherein the conductive circuit comprises at least one metal selected from the group consisting of Ag, Au and Cu.

* * * * *